United States Patent
Lee

(10) Patent No.: US 9,521,485 B2
(45) Date of Patent: Dec. 13, 2016

(54) VOLTAGE SUPPLY CIRCUIT INCLUDED IN TERMINAL EQUIPMENT

(71) Applicant: WISOL CO., LTD., Osan-si, Gyeonggi-do (KR)

(72) Inventor: Ahn Kook Lee, Suwon-si (KR)

(73) Assignee: WISOL CO., LTD., Osan-Si, Gyeonggi-Do (KR)

( * ) Notice: Subject to any disclaimer, the term of this patent is extended or adjusted under 35 U.S.C. 154(b) by 0 days.

(21) Appl. No.: 14/734,584

(22) Filed: Jun. 9, 2015

(65) Prior Publication Data

US 2016/0171969 A1    Jun. 16, 2016

(30) Foreign Application Priority Data

Dec. 10, 2014    (KR) .......................... 10-2014-0177480

(51) Int. Cl.
*H04R 3/00* (2006.01)
*H04R 1/10* (2006.01)
*G06F 1/24* (2006.01)

(52) U.S. Cl.
CPC ................. *H04R 3/002* (2013.01); *G06F 1/24* (2013.01); *H04R 1/1041* (2013.01); *G10K 2210/1081* (2013.01)

(58) Field of Classification Search
CPC ............. H04R 3/00; H04R 3/02; H04R 3/002; H04R 2460/01; H04R 1/1041; H04R 1/1083; H04R 1/1091; H04R 3/12; H04R 5/04; H04R 2420/03; H04R 2420/05; G10K 11/1788; G10K 2210/1053; G10K 2210/1081; H03G 3/345; H03G 3/348; H03F 1/30; G06F 1/24; H01R 33/74; H01R 2107/00
See application file for complete search history.

(56) References Cited

U.S. PATENT DOCUMENTS

2008/0174362 A1* 7/2008 Ishizuka .................. G05F 1/56
                                                                    327/538
2015/0135129 A1* 5/2015 Kwon .................. G06F 3/0488
                                                                    715/781

FOREIGN PATENT DOCUMENTS

| JP | 2008-158795 A | 7/2008 |
| KR | 10-0681559 B1 | 2/2007 |
| KR | 10-0770744 B1 | 10/2007 |
| KR | 10-2011-0097622 A | 8/2011 |
| KR | 10-2014-0030425 A | 3/2014 |

* cited by examiner

*Primary Examiner* — Mark Fischer
(74) *Attorney, Agent, or Firm* — LRK Patent Law Firm

(57) ABSTRACT

A voltage supply circuit included in an audio signal processing device includes a control unit for controlling a signal output from a terminal equipment; a power supply unit for outputting voltage to an earphone device according to a control signal of the control unit; and a variable circuit unit connected to the power supply unit to convert the voltage output from the power supply unit and transmit the converted voltage to the earphone device.

10 Claims, 3 Drawing Sheets

VOLTAGE SUPPLY CIRCUIT INCLUDED IN TERMINAL EQUIPMENT

BACKGROUND OF THE INVENTION

Field of the Invention

The present invention relates to a voltage supply circuit included in a terminal equipment, and more specifically, to a voltage supply circuit included in a terminal equipment, in which the voltage supply circuit includes a variable circuit unit for preventing a pop-up phenomenon generated by abrupt change of voltage when the terminal equipment supplies the voltage to an earphone device.

Background of the Related Art

An earphone device allows a user to listen to music or broadcast regardless of time and space without hindering other people when the user listens to audio using a terminal equipment. Generally, an earphone system for operating an earphone device is a system allowing a terminal equipment to sense connection of an earphone according to change of state of the head of the earphone device electrically connected to the earphone connection interface of the terminal equipment.

Active noise cancelling techniques (ANC) are introduced recently to improve quality of sound of the earphone device. The active noise cancelling technique (ANC) is a technique of analyzing frequencies, magnitudes, sound qualities and the like of various kinds of sounds flowing into the earphone device and offsetting noises by sending out sound waves of reverse wavelength through a speaker. Such an active noise cancelling technique (ANC) is stated in the 'Active Noise Cancelling System' disclosed in Korean Patent Publication No. 10-2011-0097622.

However, in order to apply such an active noise cancelling (ANC) technique to an earphone device, voltage should be supplied to the earphone device through the interface of the terminal equipment, and there is a problem in that a noise pop-up phenomenon occurs due to change of voltage when the voltage is supplied.

SUMMARY OF THE INVENTION

An object of the present invention is to reduce a pop-up phenomenon when voltage is supplied from a terminal equipment supporting an audio device to the audio device.

In addition, another object of the present invention is to reduce noise in connecting the terminal equipment and the audio device by reducing the pop-up phenomenon through implementation of a simple circuit.

In addition, still another object of the present invention is to save cost used to reduce the noise by reducing the pop-up phenomenon through implementation of a simple circuit.

To accomplish the above objects, according to one aspect of the present invention, there is provided a voltage supply circuit included in a terminal equipment, the voltage supply circuit including: a control unit for controlling a signal output from the terminal equipment; a power supply unit for outputting voltage to an earphone device according to a control signal of the control unit; and a variable circuit unit connected to the power supply unit to convert the voltage output from the power supply unit and transmit the converted voltage to the earphone device.

The variable circuit unit may include: a first resistor connected to the power supply unit to adjust magnitude of the voltage output from the power supply unit; a second resistor connected to the power supply unit to adjust the magnitude of the voltage output from the power supply unit; a third resistor for adjusting the magnitude of the voltage output from the power supply unit according to switching of the first switch; a first capacitor for adjusting any one of a speed of increasing and a speed of decreasing the magnitude of the voltage output from the power supply unit; a second capacitor for maintaining the voltage output from the power supply unit to a predetermined value; and a first switch arranged between the power supply unit and the second capacitor and switched according to a control of the control unit.

If it enters a communication mode, the control unit may turn on the first switch.

When the first switch is turned on, the magnitude of the voltage output from the power supply unit may be determined by a first resistance value, a second resistance value and a third resistance value.

When the communication mode is released, the control unit may turn off the first switch.

When the first switch is turned off, the magnitude of the voltage output from the power supply unit may be determined by a first resistance value and a second resistance value.

According to another aspect of the present invention, there is provided a terminal equipment supporting an audio device, the terminal equipment including: an interface unit for connecting a four-pole earphone device; an audio processing unit for providing an audio signal to the four-pole earphone device through the interface unit; a control unit for controlling a signal output from the terminal equipment to the earphone device; a power supply unit for outputting voltage to the earphone device according to a control signal of the control unit; and a variable circuit unit connected to the power supply unit to convert the voltage output from the power supply unit and transmit the converted voltage to the earphone device.

The variable circuit unit may include: a first resistor connected to the power supply unit to adjust magnitude of the voltage output from the power supply unit; a second resistor connected to the power supply unit to adjust the magnitude of the voltage output from the power supply unit; a third resistor for adjusting the magnitude of the voltage output from the power supply unit according to switching of the first switch; a first capacitor for adjusting any one of a speed of increasing and a speed of decreasing the magnitude of the voltage output from the power supply unit; a second capacitor for maintaining the voltage output from the power supply unit to a predetermined value; and a first switch arranged between the power supply unit and the second capacitor and switched according to a control of the control unit.

If it enters a communication mode, the control unit may turn on the first switch.

When the first switch is turned on, the control unit may determine the magnitude of the voltage output from the power supply unit based on a first resistance value, a second resistance value and a third resistance value.

When the communication mode is released, the control unit may turn off the first switch.

When the first switch is turned off, the magnitude of the voltage output from the power supply unit may be determined by a first resistance value and a second resistance value.

DETAILED DESCRIPTION OF THE PREFERRED EMBODIMENT

Details of the objects and technical configuration of the present invention described above and operational effects according thereto will be clearly understood hereinafter by the detailed description with reference to the accompanying drawings attached in the specification of the present invention.

The constitutional components expressed in this specification are merely examples for implementing the present invention. Accordingly, other components may be used in other implementations of the present invention without departing from the spirit and scope of the present invention. In addition, although each component can be implemented only in a pure hardware or software configuration, it also can be implemented by combining various hardware or software configurations performing the same function.

Expressions such as <voltage supply command>, <voltage supply circuit> and <supply voltage> of this specification may also be applied to all electrical signals which can be used in an earphone and may be applied and implemented like <electrical signal transmission command>, <electrical signal supply circuit> and <transmit an electrical signal>.

In a voltage supply circuit 100 according to an embodiment of the present invention, if it enters a communication mode while an earphone device 200 is supplied with voltage (an active mode) from a terminal equipment 101, magnitude of the voltage supplied to the earphone device 200 from the terminal equipment 101 is decreased. In addition, if it enters the active mode again from the communication mode, magnitude of the voltage supplied to the earphone device 200 from the terminal equipment 101 is increased. The voltage supply circuit 100 is a circuit for preventing a noise pop-up phenomenon generated due to abrupt change of magnitude of voltage when the magnitude of voltage is decreased or increased.

Figure 1:
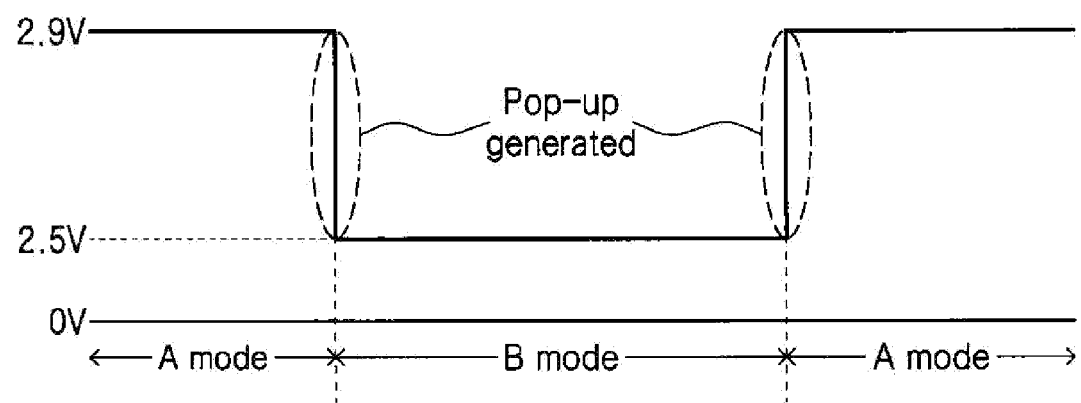
FIG. 1 is a graph showing change of voltage generating pop-up according to the prior art.

FIG. 1 is a graph schematically showing change of voltage generating pop-up according to the prior art. Referring to FIG. 1, if it is assumed that a mode of supplying voltage from the terminal equipment 101 to the earphone device 299 is A mode (active mode) and a mode of entering a communication mode is B mode, a noise pop-up phenomenon occurs due to abrupt change of voltage when the mode is changed from A mode to B mode or from B mode to A mode.

Figure 2:
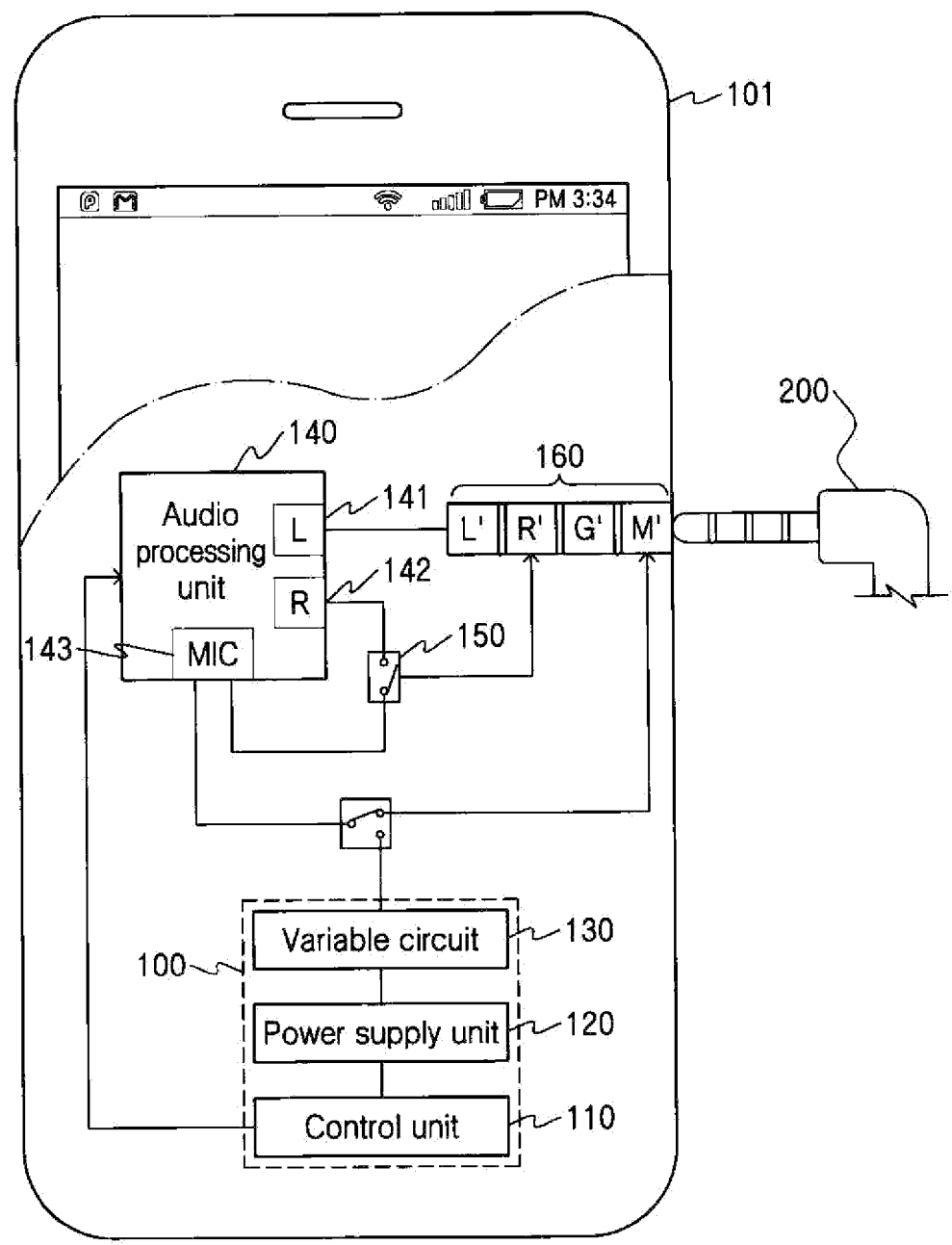
FIG. 2 is a block diagram schematically showing a terminal equipment applying a voltage supply circuit according to an embodiment of the present invention.

FIG. 2 is a block diagram schematically showing a terminal equipment applying a voltage supply circuit according to an embodiment of the present invention. Referring to FIG. 2, a voltage supply circuit 100 according to an embodiment of the present invention includes a control unit 110 for controlling a signal output from the terminal equipment 101, a power supply unit 120 for outputting voltage to the earphone device 200 according to a control signal of the control unit 110, and a variable circuit unit 130 connected to the power supply unit 120 to convert the voltage output from the power supply unit 120 and transmit the converted voltage to the earphone device 200.

The power supply unit 120 supplies voltage to the earphone device 200 according to a control signal of the control unit 110. At this point, a voltage supply circuit 100 converts the voltage output from the power supply unit 120 through the variable circuit unit 130 and transmits the converted voltage to the earphone device 200.

Figures 3, 4:
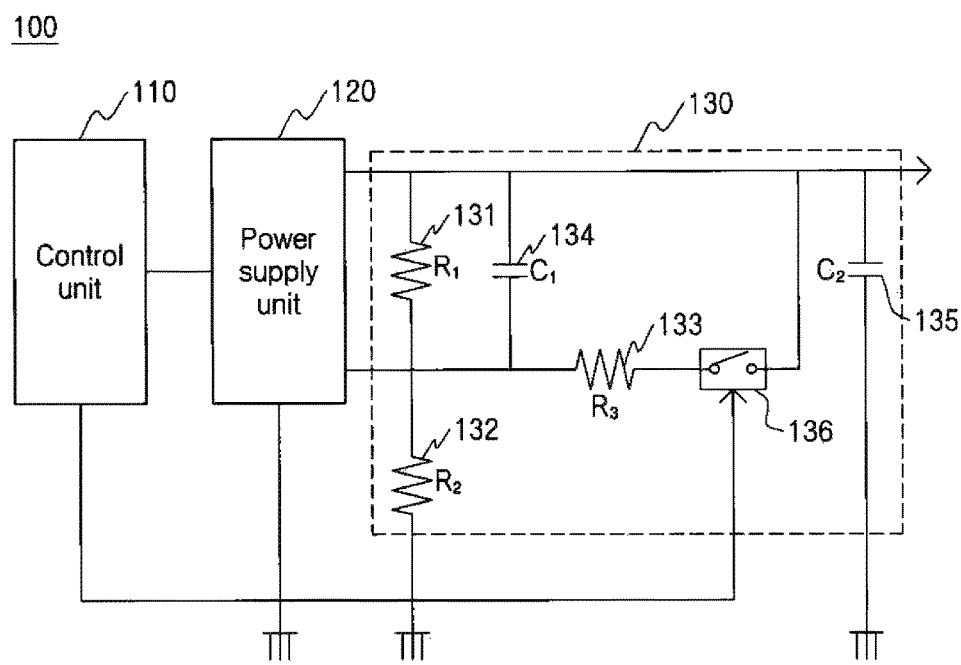
FIG. 3 is a circuit diagram schematically showing a voltage supply circuit according to an embodiment of the present invention.
FIG. 4 is a voltage change graph applying a voltage supply circuit according to an embodiment of the present invention.

FIG. 3 is a circuit diagram schematically showing a voltage supply circuit according to an embodiment of the present invention. Referring to FIG. 3, the variable circuit unit 130 according to an embodiment of the present invention includes a first resistor 131 connected to the power supply unit 120 to adjust magnitude of voltage output from the power supply unit 120, a second resistor 132 connected to the power supply unit 120 to adjust magnitude of voltage output from the power supply unit 120, a third resistor 133 connected to the power supply unit 120 to adjust magnitude of voltage output from the power supply unit 120, a first capacitor 134 for adjusting a speed of increasing or decreasing the magnitude of the voltage output from the power supply unit 120, a second capacitor 135 for maintaining the voltage output from the power supply unit 120 to a predetermined value, and a first switch 136 arranged between the power supply unit 120 and the second capacitor 135 and switched according to the control of the control unit 110.

When voltage is supplied from the terminal equipment 101 to the earphone device 200 (A mode), magnitude of the voltage supplied from the terminal equipment 101 to the earphone device 200 should be decreased to enter the communication mode (B mode). That is, voltage of the power supply unit is decreased as the first switch 136 is turned on and a resistance value is changed. At this point, the speed of decreasing the magnitude of the voltage is adjusted according to a capacitance value of the first capacitor 134. As the capacitance value increases, the speed of decreasing the magnitude of the voltage will be decreased. That is, the speed of changing the magnitude of the voltage is adjusted according to the capacitance value of the first capacitor 134. The second capacitor 135 is arranged to maintain the voltage output from the power supply unit 120 to a predetermined value. The second capacitor 135 is arranged to stabilize the value of the voltage output from the power supply unit so as not to be changed.

For example, if it enters the communication mode (B mode) while the magnitude of the voltage supplied from the terminal equipment 101 to the earphone device 200 is 2.9V (A mode), the magnitude of the voltage is decreased to 2.5V, and if the communication mode (B mode) is released and it enters the active mode (A mode), the magnitude of the voltage becomes 2.9V (A mode) again. The first capacitor 134 eliminates leakage caused by spontaneous change of voltage by adjusting the speed of increasing or decreasing the magnitude of the voltage. Generally, capacitance of the first capacitor 134 is preferably between 1 nF and 100 nF. Since the speed of changing from mode A to mode B or from mode B to mode A abruptly increases as the capacitance of the first capacitor 134 decreases, an appropriate capacitance value should be selected.

If it enters the communication mode (B mode) from the general mode (A mode), the control unit 110 connects the first resistor 131, the second resistor 132 and the third resistor 133 in parallel by turning on the first switch 136. Magnitude of the voltage supplied from the power supply unit 120 to the earphone device 200 is determined by the first resistor 131, the second resistor 132 and the third resistor 133. The magnitude of the voltage in the communication mode (B mode) is determined by a ratio between a parallel resistance value of the first resistor 131 and the third resistor 133 and a resistance value of the second resistor 132.

If the communication mode (B mode) is released and it enters the general mode (A mode) again, the control unit 110 releases the parallel connection between the first resistor 131 and the third resistor 133 by turning off the first switch 136. When the first switch 136 is turned off, the magnitude of the voltage supplied from the power supply unit 120 to the earphone device 200 is determined by the first resistor 131 and the second resistor 132. The magnitude of the voltage in the general mode (A mode) is determined by a value of ratio between the first resistor 131 and the second resistor 132.

FIG. 4 is a voltage change graph applying a voltage supply circuit according to an embodiment of the present invention. Referring to FIG. 4, if the voltage supply circuit 100 according to an embodiment of the present invention is applied, magnitude of voltage gradually decreases as shown in FIG. 4 (I) when the mode is changed from A mode to B mode and the magnitude of the voltage gradually increases as shown in FIG. 4 (II) when the mode is changed from B mode to A mode, and thus the noise pop-up phenomenon generated due to abrupt change of voltage may be prevented.

The voltage supply circuit 100 according to an embodiment of the present invention may be applied to a terminal equipment 101. The terminal equipment 101 supporting an audio device includes an interface unit 160 for connecting a four-pole earphone device 200, an audio processing unit 140 for providing an audio signal to the four-pole earphone device 200 through the interface unit 160, a control unit 110 for controlling a signal output from the terminal equipment 101 to the earphone device 200, a power supply unit 120 for outputting voltage to the earphone device 200 according to a control signal of the control unit 110, and a variable circuit unit 130 connected to the power supply unit 120 to convert the voltage output from the power supply unit 120 and transmit the converted voltage to the earphone device 200.

At this point, the variable circuit unit 130 includes a first resistor 131 connected to the power supply unit 120 to adjust magnitude of voltage output from the power supply unit 120, a second resistor 132 connected to the power supply unit 120 to adjust magnitude of voltage output from the power supply unit 120, a third resistor 133 connected to the power supply unit 120 to adjust magnitude of voltage output from the power supply unit 120, a first capacitor 134 for adjusting a speed of increasing or decreasing the magnitude of the voltage output from the power supply unit 120, a second capacitor 135 for stabilizing the voltage output from the power supply unit 120, and a first switch 136 arranged between the power supply unit 120 and the second capacitor 135 and switched according to the control of the control unit 110.

If it enters the communication mode, the control unit 110 turns on the first switch 136. When the first switch 136 is turned on, magnitude of the voltage output from the power supply unit 120 is determined based on a value of the first resistor 131, a value of the second resistor 132 and a value of the third resistor 133 by the control unit 110.

In addition, when the communication mode is released, the control unit 110 turns off the first switch 136. When the first switch 136 is turned off, magnitude of the voltage output from the power supply unit 120 is determined by a value of the first resistor 131 and a value of the second resistor 132.

If the earphone device 200 is connected to the interface unit 160 of the terminal equipment 101, a left side audio processing unit 141 and a right side audio processing unit 142 of the audio processing unit 140 transmit audio signals to the earphone device 200 through the interface unit 160 according to a control signal of the control unit 110. In addition, a microphone signal or a key signal processed by a microphone/key processing unit 143 of the audio processing unit 140 is transmitted or received through the interface unit 160 according to a control signal of the control unit 110. At this point, a second switch 150 is switched according to a control signal of the control unit 110, and voltage is supplied from the power supply unit 120 to the audio device 200 through the microphone reception terminal M'. At this point, the voltage supplied from the power supply unit 120 is transmitted to the audio device 200 as a voltage converted while passing through the variable circuit unit 130.

Since the detailed description of the variable circuit unit 130 is the same as those described above with reference to FIGS. 2 and 3, it will be omitted.

The present invention has an effect of reducing a pop-up phenomenon when voltage is supplied from a terminal equipment supporting an audio device to the audio device.

In addition, the present invention has an effect of reducing noise in connecting the terminal equipment and the audio device by reducing the pop-up phenomenon through implementation of a simple circuit.

In addition, the present invention has an effect of saving cost used to reduce the noise by reducing the pop-up phenomenon through implementation of a simple circuit.

The embodiments disclosed in the present invention are provided not to limit the technical concept of the present invention but to illustrate the technical concept of the present invention. Therefore, the scope of the technical concept of the present invention is not limited by such embodiments. The scope of the protection of the present invention should be determined by reasonable interpretation of the appended claims and all technical concepts coming within the equivalency range of the present invention should be interpreted to be embraced in the scope of the right of the present invention.

What is claimed is:

1. A voltage supply circuit included in a terminal equipment, the voltage supply circuit comprising:
   a control unit for controlling a signal output from the terminal equipment;
   a power supply unit for outputting voltage to an earphone device according to a control signal of the control unit; and
   a variable circuit unit connected to the power supply unit to convert the voltage output from the power supply unit and transmit the converted voltage to the earphone device,
   wherein the variable circuit unit comprises:
   a first resistor connected to the power supply unit to adjust magnitude of the voltage output from the power supply unit;
   a second resistor connected to the power supply unit to adjust the magnitude of the voltage output from the power supply unit;
   a third resistor for adjusting the magnitude of the voltage output from the power supply unit according to switching of a first switch;
   a first capacitor for adjusting any one of a speed of increasing and a speed of decreasing the magnitude of the voltage output from the power supply unit;
   a second capacitor for maintaining the voltage output from the power supply unit to a predetermined value; and
   the first switch arranged between the power supply unit and the second capacitor and switched according to a control of the control unit.

2. The voltage supply circuit according to claim 1, wherein if the voltage supply circuit enters a communication mode, the control unit turns on the first switch.

3. The voltage supply circuit according to claim 2, wherein when the first switch is turned on, the magnitude of the voltage output from the power supply unit is determined by a first resistance value, a second resistance value and a third resistance value.

4. The voltage supply circuit according to claim 1, wherein when a communication mode is released, the control unit turns off the first switch.

5. The voltage supply circuit according to claim 4, wherein when the first switch is turned off, the magnitude of the voltage output from the power supply unit is determined by a first resistance value and a second resistance value.

6. A terminal equipment supporting an audio device, the terminal equipment comprising:
   an interface unit for connecting a four-pole earphone device;
   an audio processing unit for providing an audio signal to the four-pole earphone device through the interface unit;
   a control unit for controlling a signal output from the terminal equipment to the earphone device;
   a power supply unit for outputting voltage to the earphone device according to a control signal of the control unit; and
   a variable circuit unit connected to the power supply unit to convert the voltage output from the power supply unit and transmit the converted voltage to the earphone device,
   wherein the variable circuit unit includes:
   a first resistor connected to the power supply unit to adjust magnitude of the voltage output from the power supply unit;
   a second resistor connected to the power supply unit to adjust the magnitude of the voltage output from the power supply unit;
   a third resistor for adjusting the magnitude of the voltage output from the power supply unit according to switching of a first switch;
   a first capacitor for adjusting any one of a speed of increasing and a speed of decreasing the magnitude of the voltage output from the power supply unit;
   a second capacitor for maintaining the voltage output from the power supply unit to a predetermined value; and
   the first switch arranged between the power supply unit and the second capacitor and switched according to a control of the control unit.

7. The terminal equipment according to claim 6, wherein if the terminal equipment enters a communication mode, the control unit turns on the first switch.

8. The terminal equipment according to claim 7, wherein when the first switch is turned on, the control unit determines the magnitude of the voltage output from the power supply unit based on a first resistance value, a second resistance value and a third resistance value.

9. The terminal equipment according to claim 6, wherein when a communication mode is released, the control unit turns off the first switch.

10. The terminal equipment according to claim 9, wherein when the first switch is turned off, the magnitude of the voltage output from the power supply unit is determined by a first resistance value and a second resistance value.

* * * * *